(12) United States Patent
Jie et al.

(10) Patent No.: US 9,722,164 B2
(45) Date of Patent: Aug. 1, 2017

(54) FABRICATION OF STABLE ELECTRODE/DIFFUSION BARRIER LAYERS FOR THERMOELECTRIC FILLED SKUTTERUDITE DEVICES

(71) Applicants: University of Houston System, Houston, TX (US); Massachusetts Institute of Technology, Cambridge, MA (US)

(72) Inventors: Qing Jie, Houston, TX (US); Zhifeng Ren, Houston, TX (US); Gang Chen, Cambridge, MA (US)

(73) Assignees: UNIVERSITY OF HOUSTON SYSTEM, Houston, TX (US); MASSACHUSETTS INSTITUTE OF TECHNOLOGY, Cambridge, MA (US)

( * ) Notice: Subject to any disclaimer, the term of this patent is extended or adjusted under 35 U.S.C. 154(b) by 0 days.

(21) Appl. No.: 14/873,503

(22) Filed: Oct. 2, 2015

(65) Prior Publication Data
US 2016/0204326 A1  Jul. 14, 2016

Related U.S. Application Data

(62) Division of application No. 14/310,840, filed on Jun. 20, 2014, now Pat. No. 9,209,378.

(60) Provisional application No. 61/837,545, filed on Jun. 20, 2013.

(51) Int. Cl.
*H01L 21/00* (2006.01)
*H01L 35/14* (2006.01)
(Continued)

(52) U.S. Cl.
CPC .............. *H01L 35/14* (2013.01); *H01L 35/08* (2013.01); *H01L 35/20* (2013.01); *H01L 35/22* (2013.01); *H01L 35/34* (2013.01)

(58) Field of Classification Search
USPC ........................................................ 438/54
See application file for complete search history.

(56) References Cited

U.S. PATENT DOCUMENTS

| 2006/0118158 A1 | 6/2006 | Zhang et al. |
| 2012/0000500 A1 | 1/2012 | Iida et al. |
| 2013/0126800 A1 | 5/2013 | Backhaus-Ricoult |
| 2013/0247953 A1* | 9/2013 | Muto ............... H01L 35/08 136/240 |

FOREIGN PATENT DOCUMENTS

| EP | 1972604 A1 | 9/2008 |
| JP | 2001320096 A | 11/2001 |
| JP | 2011114291 A | 6/2011 |

OTHER PUBLICATIONS

PCT/US2014/043461 International Search Report and Written Opinion dated Oct. 17, 2014 (11 p.).

(Continued)

*Primary Examiner* — Timor Karimy
(74) *Attorney, Agent, or Firm* — Conley Rose, P.C.

(57) ABSTRACT

Disclosed are methods for the manufacture of n-type and p-type filled skutterudite thermoelectric legs of an electrical contact. A first material of $CoSi_2$ and a dopant are ball-milled to form a first powder which is thermo-mechanically processed with a second powder of n-type skutterudite to form a n-type skutterudite layer disposed between a first layer and a third layer of the doped-$CoSi_2$. In addition, a plurality of components such as iron, and nickel, and at least one of cobalt or chromium are ball-milled form a first powder that is thermo-mechanically processed with a p-type skutterudite layer to form a p-type skutterudite layer "second layer" disposed between a first and a third layer of the first powder. The specific contact resistance between the first layer and the skutterudite layer for both the n-type and the p-type skutterudites subsequent to hot-pressing is less than about 10.0 $\mu\Omega\cdot cm^2$.

9 Claims, 21 Drawing Sheets

(51) Int. Cl.
*H01L 35/34* (2006.01)
*H01L 35/20* (2006.01)
*H01L 35/22* (2006.01)
*H01L 35/08* (2006.01)

(56) References Cited

OTHER PUBLICATIONS

Notice of Allowance dated Aug. 10, 2015 for U.S. Appl. No. 14/310,840 (8 p.).
European Partial Supplementary Search Report dated Jan. 19, 2017, for European Application No. 14814268.0 (5 p.).
Shimazu, Hiromi, et al., "Improvements in Thermal Stability of Cobalt-Silicide Films by Adding Nickel," Journal of the Society of Materials Science, Japan, vol. 57, No. 9, pp. 929-935, Sep. 2008 (7 p.).
Muto, Andrew, et al., "Skutterudite Unicouple Characterization for Energy Harvesting Applications," Advanced Energy Materials, vol. 3, pp. 245-251, 2013 (7 p.).
Muto, Andrew, "Thermoelectric Device Characterization and Solar Thermoelectric System Modeling," Massachusetts Institute of Technology, Department of Mechanical Engineering, Sep. 2011 (155 p.).
European Extended Search Report dated Apr. 4, 2017, for European Application No. 14814268.0 (13 p.).
Guo, J.Q., et al., "Development of Skullerudite Thermoelectric Materials and Modules," Journal of Electronic Materials, vol. 41, No. 6, Feb. 25, 2012, pp. 1036-1042 (7 p.).

\* cited by examiner

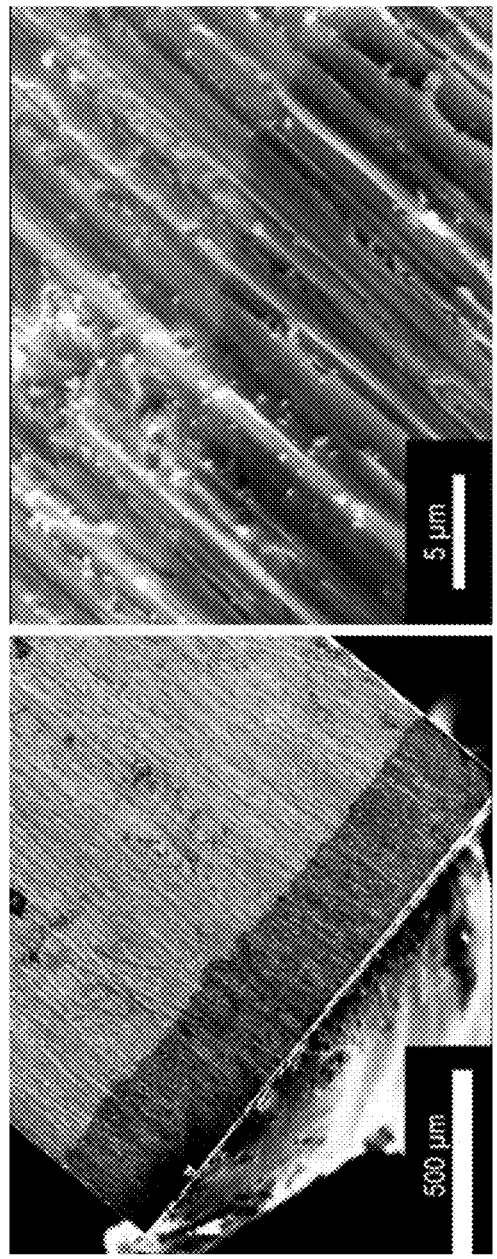

FABRICATION OF STABLE ELECTRODE/DIFFUSION BARRIER LAYERS FOR THERMOELECTRIC FILLED SKUTTERUDITE DEVICES

CROSS-REFERENCE TO RELATED APPLICATIONS

This application is a divisional of U.S. application Ser. No. 14/310,840 filed Jun. 20, 2014, and entitled "Fabrication of Stable Electrode/Diffusion Barrier Layers for Thermoelectric Filled Skutterudite Devices," which claims priority to and incorporates by reference in its entirety U.S. Provisional Application No. 61/837,545, filed Jun. 20, 2013, and entitled "Fabrication of Stable Electrode/Diffusion Barrier Layers for Thermoelectric Filled Skutterudite Devices."

STATEMENT REGARDING FEDERALLY SPONSORED RESEARCH OR DEVELOPMENT

This work is supported by the U.S. Department of Energy under award number DE-EE0005806.

BACKGROUND

Field of the Disclosure

The disclosure relates generally to skutterudite thermoelectric materials. More particularly, the disclosure relates to materials that may be used as electrical contacts and the diffusion barrier layers in thermoelectric legs.

Background of the Technology

Thermoelectric energy conversion devices are attractive because they have no moving parts, are capable of high power densities, scalable in size, and are potentially highly reliable. These devices can be used to improve the overall efficiency of existing apparatus and systems by recovering waste heat, for example from vehicle exhaust, and to develop new systems such as solar thermoelectric energy converters.

BRIEF SUMMARY OF THE DISCLOSURE

In an embodiment, a method of manufacturing a thermoelectric component comprising: thermo-mechanically processing a first material, with a second powder to form a thermoelectric component, wherein the first material is ball-milled prior to thermo-mechanical processing to form a ball-milled first powder, wherein the ball-milled first powder comprises $CoSi_2$ and a dopant, wherein the second powder comprises n-type filled skutterudite, and wherein the second powder is disposed in contact with a first layer of the ball-milled first powder and a second layer of the ball-milled first powder prior to thermo-mechanical processing; wherein, subsequent to thermo-mechanical processing, a specific contact resistance between the first layer of the ball-milled first powder and the second powder is less than about 10.0 $\mu\Omega \cdot cm^2$, and wherein a specific contact resistance between the second layer of the ball-milled first powder and the second powder is less than about 10.0 $\mu\Omega \cdot cm^2$.

In an alternate embodiment, a method of manufacturing a thermoelectric component comprising: thermo-mechanically processing a ball-milled first powder and a second powder, wherein the ball-milled first powder comprises at least two of iron (Fe), chromium (Cr), cobalt (Co), and nickel (Ni), and wherein the second powder is disposed between a first layer of the ball-milled first powder and a second layer of the ball-milled first powder prior to thermo-mechanical processing; and wherein, subsequent to the thermo-mechanical processing, a specific contact resistance between the first layer of the ball-milled first powder and the second powder is less than about 10.0 $\mu\Omega \cdot cm^2$, and wherein a specific contact resistance between the second layer of the ball-milled first powder and the second powder is less than about 10.0 $\mu\Omega \cdot cm^2$.

Exemplary embodiments described herein comprise a combination of features and characteristics intended to address various shortcomings associated with certain prior devices, compositions, systems, and methods. The various features and characteristics described above, as well as others, will be readily apparent to those of ordinary skill in the art upon reading the following detailed description, and by referring to the accompanying drawings. It should be understood that the conception and the specific exemplary embodiments disclosed may be readily utilized as a basis for modifying or designing other compositions, structures, systems and/or methods for carrying out the same purposes of the embodiments disclosed herein. It should also be understood that such equivalent constructions do not depart from the spirit and scope of the invention as set forth in the appended claims.

BRIEF DESCRIPTION OF THE DRAWINGS

For a detailed description of the disclosed exemplary embodiments of the invention, reference will now be made to the accompanying drawings in which:

FIGS. 10A and 10B are pictures taken using an SEM of the interface between the TE material and the contact layer fabricated according to certain embodiments of the present disclosure.

DETAILED DESCRIPTION OF THE DISCLOSED EMBODIMENTS

Figure 1A:
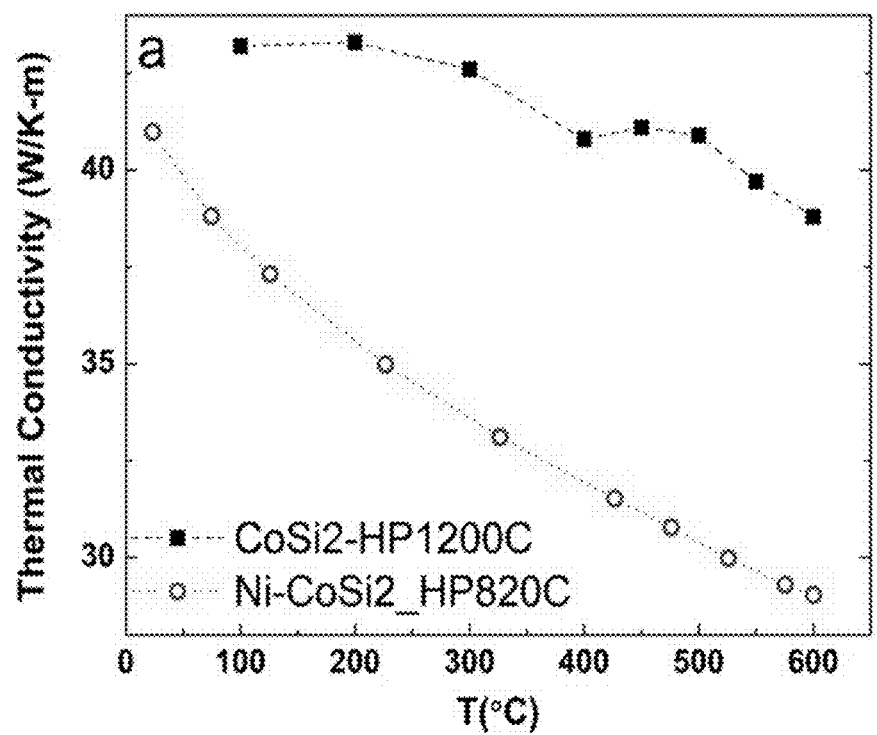
FIGS. 1A-1C illustrate the thermal conductivity, resistivity, and Seebeck coefficient's response to increasing temperature in a doped-$CoSi_2$ sample as compared to an undoped sample.

The following discussion is directed to various exemplary embodiments. However, one of ordinary skill in the art will understand that the examples disclosed herein have broad application, and that the discussion of any embodiment is meant only to be exemplary of that embodiment, and not intended to suggest that the scope of the disclosure, including the claims, is limited to that embodiment.

The drawing figures are not necessarily to scale. Certain features and components herein may be shown exaggerated in scale or in somewhat schematic form and some details of conventional elements may not be shown in interest of clarity and conciseness.

In the following discussion and in the claims, the terms "including" and "comprising" are used in an open-ended fashion, and thus should be interpreted to mean "including, but not limited to . . . ". By some estimates, only 40% of the total energy input in society/industry is converted into useful energy and the rest may be lost in the form of waste heat. Recovering this waste heat and converting it into electricity may reduce the consumption of fossil fuels and therefore benefit the environment. Thermoelectric (TE) power generation devices may be attractive for waste heat recovery because these devices may operate without moving parts, are capable of high power densities, and may be highly reliable given the appropriate manufacturing and packaging (transport and shelf life) techniques and materials. In some instances, those TE devices may also be used to convert solar energy into electricity.

In general, a thermoelectric leg is a part of a thermoelectric power generation module ("thermoelectric module") by converting temperature differences into electricity. Heat is pulled from one side of the thermoelectric cooling system to the other side, these sides may be referred to as the "hot" side which is at a temperature above ambient temperature, and the "cool" side may be at about ambient temperature and may be attached to a heat sink. A plurality of thermoelectric legs may be disposed in a thermoelectric module as described in FIG. 8, between the hot side (818 in FIG. 8) of the thermoelectric module and the cool side of the thermoelectric module which may also be at about ambient temperature and may be described as a heat sink (814 in FIG. 8) using a contact layer as discussed in FIG. 8. It may be challenging to thermoelectric legs to use in electrical contacts since thermoelectric legs usually have a high electrical conductivity and a small length in the current flow direction. Accordingly, the overall resistance of the leg itself is small. This may mean that very small electrical contact resistances ("specific contact resistance") between the electrodes and the thermoelectric materials are desirable. In addition, the thermal stresses, parasitic thermal resistances, and chemical stability may be considered when designing and manufacturing electrical contacts. Discussed herein are certain embodiments for the fabrication and use of contact materials for use with n-type and p-type filled skutterudites such that the contact materials have work functions compatible with and/or substantially similar to that of the n-type or p-type filled skutterudite, depending on which type of skutterudite is used in a given application.

Further, as used herein, a first work function is "close" to a second work function or "substantially similar" to a second work function in the instance where the first and the second materials can be coupled and exposed to temperatures within an operating range that the coupled materials would be exposed to in a device or assembly. This may also be described as two materials being compatible, or a property such as the work function of each material being compatible, where it is understood that compatibility describes the ability of the materials to be assembled and perform together for an intended purpose in an intended apparatus or application. In some embodiments, this may mean that the respective work functions, or values representing or corresponding to work functions of the contact material and TE leg material, are within about 15% of each other, in alternate embodiments this may mean that they are within about 10% of each other, and in still other embodiments they may range anywhere between less than 1% to about 20% of each other.

Thermoelectric properties are temperature-dependent and can vary significantly from the hot side to the cold side of an electrical contact assembly (i.e., as the temperature varies across the contact) that may be used to draw heat from a device or other source. This may be especially true for power generation applications when the hot and the cold side temperature difference can span several hundred degrees. In addition, non-ideal factors such as electrical and thermal contact and spreading resistances, and heat losses at the side walls of the legs degrade the device efficiency. Although materials' dimensionless figure of merit (ZT) are often reported, thermoelectric device testing is used to link the materials to appropriate applications and to validate the ZT measurements. The dimensionless figure of merit (ZT) is a measurement based upon the Seebeck coefficient (S), the electrical conductivity ($\sigma$), thermal conductivity ($\kappa$), and the absolute temperature (T) of a particular thermoelectric material. The ZT is related to the conversion efficiency of thermoelectric materials, that is, to the ability of thermoelectric materials to convert waste heat into electrical energy. Filled skutterudites are mid-temperature thermoelectric materials used for heat-to electricity conversion with relatively high ZT (dimensionless figure of merit) values, where "relatively high ZT values" may be defined by the type of skutterudite (n-type~1.7, p-type~1.1).

As disclosed herein, powder, foil, pellets or other forms of electrode material may be ball-milled and hot-pressed together with skutterudite powder into a leg at the temperatures used to hot-press skutterudite pellets (about 820° C. for n-type, and about 700° C. for p-type) in order to reduce and/or avoid cracking on electrodes and thereby prepare thinner electrode/barrier layers.

As discussed herein, an electrical contact is an electrical circuit component found in electrical relays and switches as well as breakers. An electrical contact assembly is typically composed of two pieces of electrically conductive metal. The two pieces may pass electrical current when a gap between the two pieces is closed, or may act as an insulator when the gap between them is open. Depending upon the end use/application, this gap may comprise an insulating medium of air, an electrically insulating fluid, or may be a vacuum. However, the heat-to-electricity conversion efficiency of a thermoelectric device depends on not only the ZT value of thermoelectric materials, but also on the quality of the electrical contacts, which may be referred to as contact components in FIG. 8 below. The quality of the electrical contacts/contact component refers to the material used for the contacts, as well as the compatibility of the contact component with the skutterudite. The systems and methods disclosed herein were used to prepare filled skutterudite legs that comprise the skutterudite and a barrier layer which have at least compatible work functions for use and assembly in a thermoelectric module.

In an embodiment, a "good" electrode/barrier should have a similar thermal expansion coefficient as the thermoelectric material so that there is no cracking, crazing, or other problems with the mechanical, thermal, and electrical integrity of the legs. At the same time, it may be desirable for this electrode/barrier material to have high thermal conductivity and electrical conductivity. Conventionally, $CoSi_2$ and $Co_2Si$ have been used as electrode and diffusion barrier materials, respectively, for n and p-type filled skutterudites. The respective thermal expansions of these materials match very well with the thermal expansion of n-type and p-type skuteruditees. It is understood that matching the thermal expansion of mated, coupled, or materials that are otherwise in contact may lessen the chance of delamination, cracking, or other failures that may cause partial or catastrophic failure of the component and/or device comprising these materials.

The performance of a thermoelectric material may be characterized by its dimensionless figure of merit, $ZT=S^2T/\rho k$ where $S(T)$, $\rho(T)$, $k(T)$ are the temperature-dependent Seebeck coefficient, electrical resistivity, and thermal conductivity, respectively, and T is the absolute temperature. If the material properties are independent of temperature then the maximum efficiency of a thermoelectric leg can be expressed as $$\eta_{max} = \frac{T_{Hot} - T_{cold}}{T_{Hot}} \frac{\sqrt{1+Z\overline{T}} - 1}{\sqrt{1+Z\overline{T}} + \frac{T_{Cold}}{T_{Hot}}}, \quad (1)$$

where $T_{Hot}$ is the hot side temperature, $T_{Cold}$ is the cold side temperature, and $\overline{T}$ is the arithmetic average of $T_{Cold}$ and $T_{Hot}$.

In an embodiment, it may be desirable for $CoSi_2$ to be first hot-pressed at very high temperatures (1200° C.) to form a dense pellet or other appropriate component. In another embodiment, $Co_2Si$ may also be first hot-pressed at, for example, 1100° C. to form a dense pellet or other component. Then each type of disk ($Co_2Si$ and $CoSi_2$) may be hot-pressed together with a type of skutterudite powder in order to form the leg. Since $CoSi_2$ and $Co_2Si$ may be brittle, the samples may be prone to cracking during the second time hot-pressing unless thick, costly, electrode/diffusion barrier disks are used. This results in undesirable large thermal and electrical resistance cross the electrodes.

Figure 8:
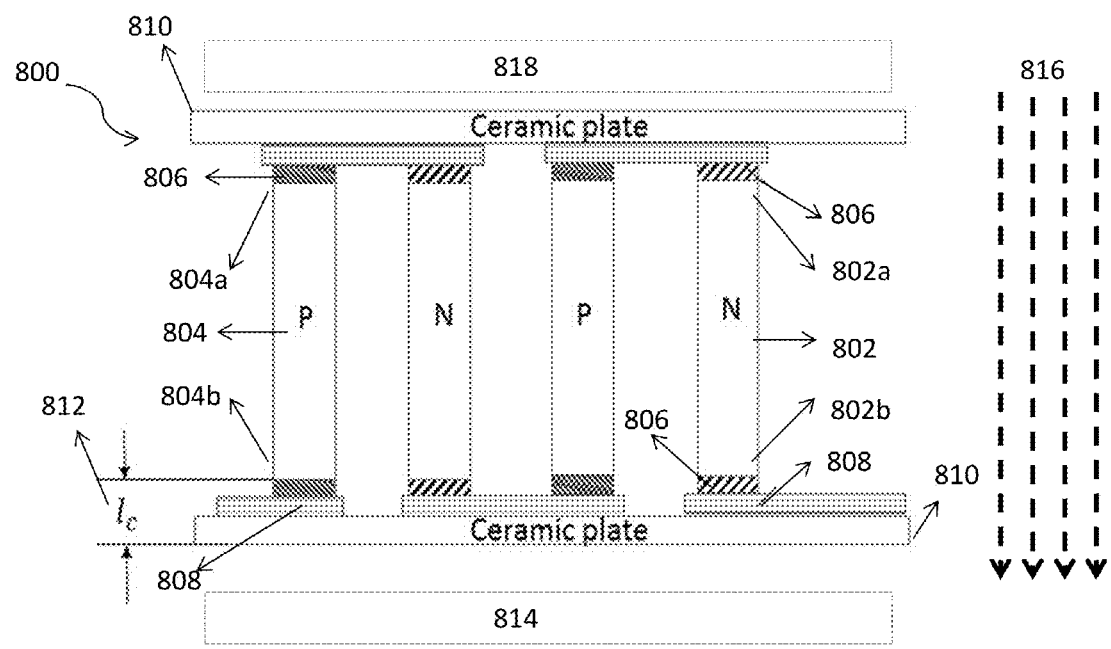
FIG. 8 is a schematic illustration a thermoelectric module according to certain embodiments of the present disclosure.

FIG. 8 is a schematic illustration a thermoelectric module according to certain embodiments of the present disclosure. As shown in FIG. 8, and discussed further below, a thermoelectric module 800 may comprise thermoelectric components (which may be referred to as legs or elements) of n-type 802 and p-type 804 filled skutterudite as well as are several layers between the TE components 802 and 804, the heat source 818 and the heat sink 814. As indicated by the dotted arrows 816, the heat is pulled from the heat source 818 to the heat sink, and the ceramic plate 810 may be in direct contact with the heat source 818 and/or the heat sink 814. In other embodiments, the ceramic plate may not be coupled to or in contact with the heat source 818 and/or the heat sink 814 but may be in close enough proximity to serve the heat transfer function. The plurality of TE materials including p-type filled skutterudite 802 and n-type filled skutterudite 804 components are disposed, for example, in an alternating fashion in the thermoelectric module 800. In this embodiment, each of the filled skutterudite components 802 and 804 comprises a first end 802a or 804a, respectively, and a second end, 802b and 804b, respectively. These layers may comprise metal interconnects that may be referred to as a conductive strip 808 that may be used for electrical conduction between the TE materials 802 and 804 and the ceramic plate 810 for electrical isolation and structure stability.

It is understood that the ceramic plate 810 actually comprises two plates, where one is disposed on the heat source 818 side and one is disposed on the heat sink 814 side, and that the conducting strip 808 and the contact component 806 are also representative of those components that may be disposed on both the heat source 818 side and the heat sink 814 side of the thermoelectric module 800. The contact component 806 that is in contact with the TE materials 802 and 804 may be either difficult to directly solder onto the interconnect/conductive strip 808 or the TE materials 802 and 804 may react with the solder material and degrade at the working temperature. Therefore, a contact component 806 is disposed between TE elements and interconnects 808 in order to increase the electrical and thermal resistances.

The contact layer 812 may be in contact with each of the ends 802a, 802b, 804a, and 804b, and may comprise components such as the contact component 806, the conducting strip 808, and the ceramic plate 810. In an embodiment, each end (802a, 802b, 804a, 804b) is in contact with a contact component 806. This contact component 806 is illustrated as a series of pieces in FIG. 8, but in alternate embodiments, it may be a single, contiguous piece, and in alternate embodiments, the contact component 806 may comprise a plurality of separate pieces. A conducting strip 808 may be disposed in contact with the contact layer on one or both ends of 802 and 804. As illustrated in FIG. 8, the conducting strip may be segmented and shared by one or more of the components 802, 804, and in some embodiments it may be a contiguous piece across all of those components. The conducting strip 808 in contact with the contact component 806 that is in contact with each of the first and second ends 802a, 802b, 804a, 804b of the components 802 and 804 may be in contact with a ceramic plate 810. It is understood that this is an illustrative example and that in other embodiments, different configurations, for example, different contact layer thicknesses $l_c$ may be utilized.

Considering these factors, the power output P and conversion efficiency $\eta$ of a thermoelectric module, when operated with a matched load, can be expressed as $$P = \frac{s^2}{2\rho} \frac{AN(T_h - T_c)^2}{(n+l)\left(1 + \frac{2rl_c}{l}\right)^2}, \quad (2)$$

$$\eta = \left(\frac{T_h - T_c}{T_h}\right) \bigg/ \left\{\left(1 + \frac{2rl_c}{l}\right)^2 \left[2 - \frac{1}{2}\left(\frac{T_h - T_c}{T_h}\right) + \left(\frac{4}{ZT_h}\right)\left(\frac{l+n}{l+2rl_c}\right)\right]\right\} \quad (3)$$

where N is the number of n-p pairs in a module, A and l are the cross-sectional area and thermoelement length, respectively, $l_c$ is the thickness of the contact layer, $n=2\rho_c/\rho$ and $r=\kappa/\kappa_c$ ($\rho_c$ is the electrical contact resistivity, $\kappa_c$ is the thermal contact conductivity). It is obvious that the contact materials with high thermal and electrical conductivity are favorable for high device performance. In addition, reducing the contact resistivity between the contact layer and thermoelectric leg may be desirable. The preferred contact material may have all of the following characteristics: 1) high electrical conductivity, 2) high thermal conductivity, 3) a coefficient of thermal expansion similar to TE elements, 4) can be fabricated to be thin enough to reduce total electrical and thermal resistances, 5) low contact resistance at the interface between the contact layer and the TE layer, 6) stable at the working high temperature, and 7) form a strong mechanical bond with the TE layer. In summary, a preferred contact material will couple to the TE layer and comprise desirable properties including a work function (that may be interpreted by the measured contact resistance) close to that of the TE layer. As used herein, the "work function" is the minimum thermodynamic work (i.e., energy) needed to remove an electron from a solid to a point in the vacuum immediately outside the solid surface and may be expressed in terms of electron volts (eV).

In one embodiment, the contact resistance between an electrode to a thermoelectric material may be minimized by preparing a series of Fe-based alloys with different work functions as the contact layer for p-type filled skutterudite ($Ce_{0.45}Nd_{0.45}Fe_{3.5}Co_{0.5}Sb_{12}$) thermoelectric material using ball-milling plus direct current hot-pressing technique. The alloys disclosed herein have high thermal and electrical conductivities and their thermal expansion coefficients are substantially similar to that of the p-type filled skutterudite. In addition, the contact resistivity between these alloys and p-type filled skutterudite is related to the work function difference of the contact and the thermoelectric material. In one embodiment, by following this work function matching principle, metalized p-type filled skutterudite materials with specific contact resistance smaller than 1 $\mu\Omega cm^2$ have been achieved, which can minimize the internal parasite loss in filled skutterudite thermoelectric modules. In this embodiment, the work function was the guiding principle/measurement used to fabricate materials with contact resistance close to zero and this principle was used with p-type filled skutterudite material, but the use is not restricted to this type of material. Close matching of the work functions of the contact material with that of the TE material may lead to low contact resistance with a variety of TE and contact material combinations.

Figure 1B:
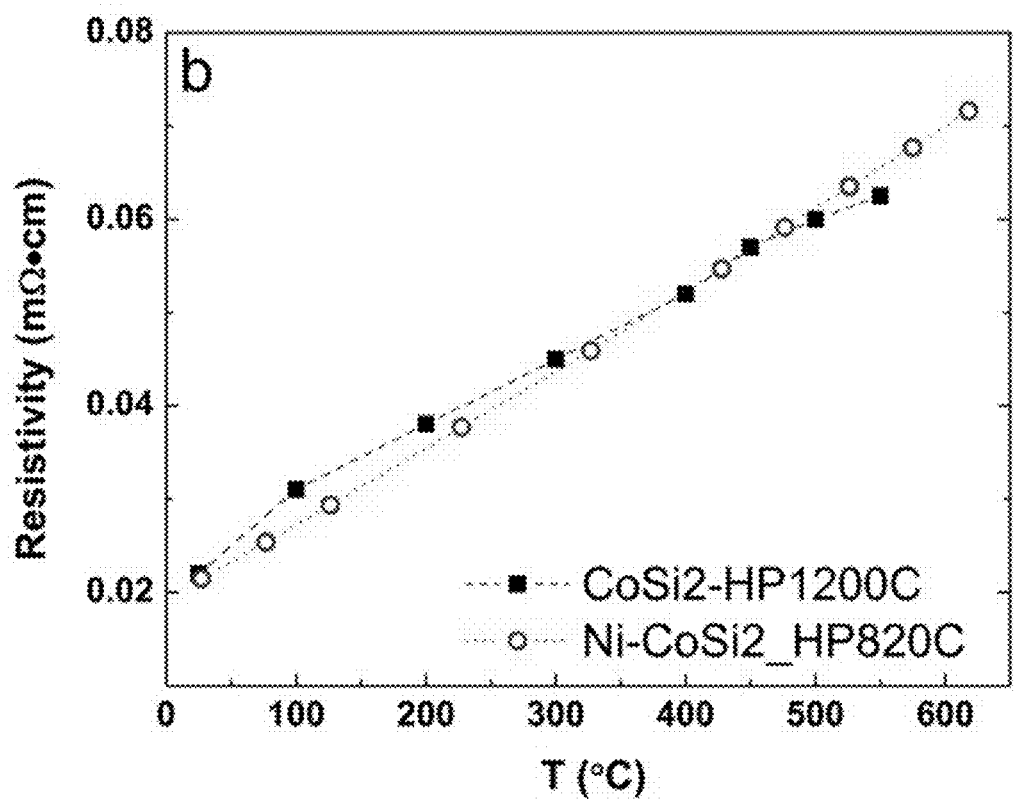
Figure 1C:
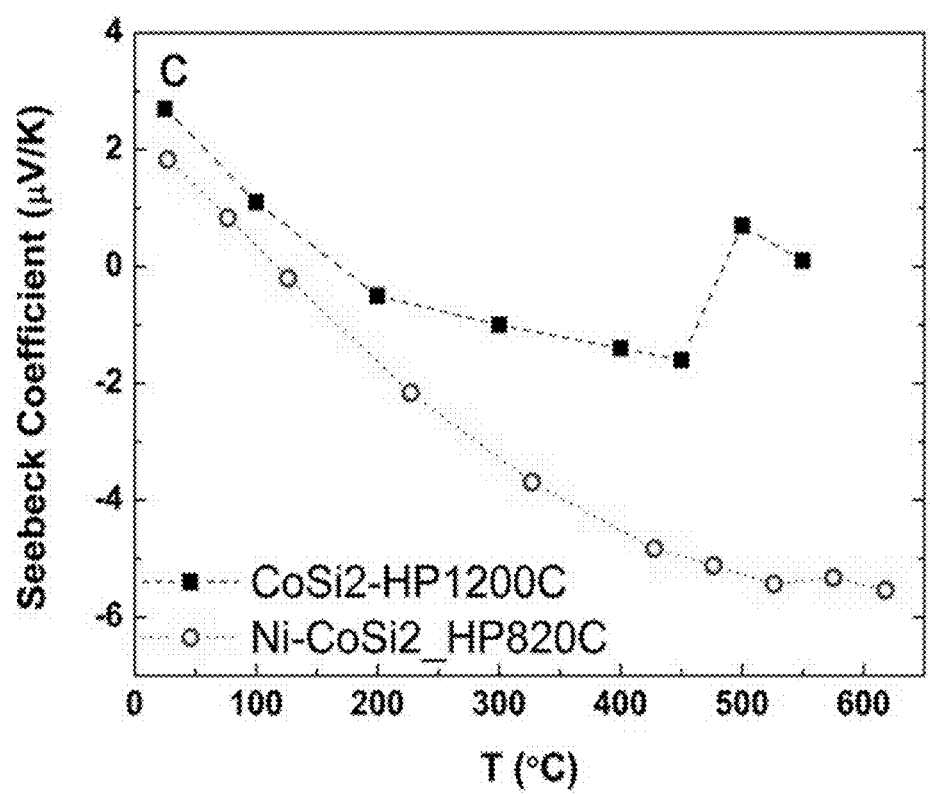

Sample Preparation:

FIGS. 1A-1C illustrate the thermal conductivity, resistivity, and Seebeck coefficient's response to increasing temperature in a doped-$CoSi_2$ sample as compared to an undoped sample. The $CoSi_2$ was doped with Ni using the following process: An ingot was first prepared by arc-melting 0.1 gram Ni together with 20 grams $CoSi_2$. The ingot was then annealed at 1080° C. for 10 hours. The annealed ingot was broken into powder by 1 hour of ball-milling, and then the powder was hot-pressed at 820° C. for 5 minutes to form the pellet for testing.

For p-type legs, contact material powders were also fabricated by directly ball-milling the pure element powders of Fe (−200 mesh, 99%, Alfa Aesar), Ni (APS 2.2-3 µm, 99.9%, Alfa Aesar), Cr (−200 mesh, 99.95%, Alfa Aesar), or Co (−325 mesh, 99.5%, Alfa Aesar). The powders were weighted according to the stoichiometric formulas (note: all compositions are nominal that may change a little bit during the process of ball-milling and hot-pressing, but the difference should be very small) and loaded into a 65 ml hardened steel grinding vial together with two ½" (12.7 mm) and four ¼" (6.35 mm) hardened 440C stainless steel balls in a glove box with the protection of Ar gas. To prevent oxidization, the ball-milling vial was properly sealed inside the glove box. The vial was then inserted into a SPEX high energy ball-milling machine (8000M) and ball-milled for one hour. In this example, five different iron-based alloy powders were prepared according to the general formulas of: $Co_{0.25}Fe_{0.25}Ni_{0.5}$, $Cr_{0.3}Fe_{0.1}Ni_{0.6}$, $Cr_{0.2}Fe_{0.6}Ni_{0.2}$, $Cr_{0.3}Fe_{0.6}Ni_{0.1}$ and $Cr_{0.3}Fe_{0.6}Co_{0.1}$. After ball-milling, about 1.5 grams of each alloy powder was hot-pressed under a pressure of 76 MPa at 650° C. for 5 minutes to form a pellet.

The thermal conductivity (FIG. 1A), electrical resistivity (FIG. 1B), and Seebeck coefficient (FIG. 1C) were obtained from the hot-pressed pellets as described herein. The thermal diffusivity (α) was measured on a laser flash apparatus (Netzsch LFA 457). After that, a bar sample with approximate dimensions of 1.6×2×12 mm³ was cut from each pellet for the electrical resistivity and Seebeck coefficient measurement. The electrical resistivity (FIG. 1B) and Seebeck coefficient (FIG. 1C) were simultaneously measured on a commercial system (ULVAC ZEM-3) using the four-point dc current-switching method and the static temperature difference method. The specific heat capacity of the sample was determined on a DSC system (Netzsch DSC 404 C). The volume density (D) was quantified by an Archimedes method. The total thermal conductivities were then calculated using the relationship $\kappa_{total}=D\alpha C_p$. The coefficient of thermal expansion was measured on rectangular solid samples (typically 2 mm×2 mm×12 mm) using a dilatometer (Netzsch TMA 402 F1) in a nitrogen atmosphere.

The ball-milled alloy powder and filled skutterudite powder were loaded layer by layer into a graphite die with an inner diameter of 12.7 mm and pressed by direct current induced hot-pressing (dc-HP) to produce the final discs for measurements. After loading each layer, a rod with a diameter of half an inch was used to spread the powder evenly and press the powder to get a relatively dense and flat surface.

Figure 3A:
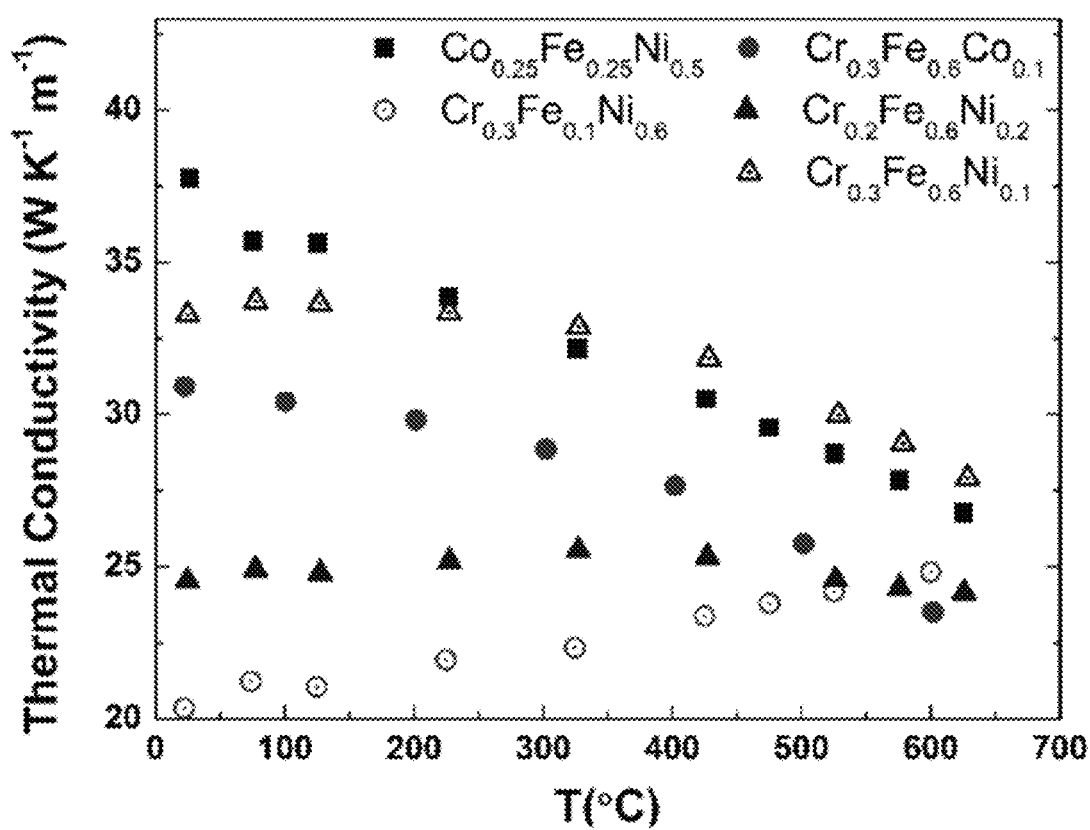
FIGS. 3A-3D illustrate the effect of increasing temperature on the thermal conductivity, resistivity, and Seebeck coefficient of different barrier materials for multiple alloy compositions fabricated according to certain embodiments of the present disclosure.

The configuration of the leg fabrication is shown in FIG. 8, as previously discussed. The pressure used for hot-pressing was 76 MPa. The powder was heated to about 700° C. for the p-type and 820° C. for the n-type in 3 minutes, and kept at this temperature for 5 minutes before the heating power was cut off for cooling. The hot-pressed pellets were then cut and polished into material with a cross-section of about 2×2 mm². To get a smooth surface, the #2000 sand paper was used to finish the polishing. The contact resistance was measured using a home-made device, the configuration of which is shown in FIG. 3A below.

Three wires were soldered on the contact layers at the two ends of the TE leg. The leg was fixed to a glass substrate with the help of a double-sided tape. A Keithley 2400 Digital SourceMeter was used to feed DC current (I) into the leg through two wires. A spring-loaded pogo pin (tip size~2 µm) was mounted on Zaber motorized XY translation stage and scan from one end to the other end of the leg. A Keithley 2182 NanoVoltMeter is used to record the voltage between the pogo pin and the third wire as a function of the position. All these devices are controlled by a Labview program. Each data point was averaged over ten measurements with the current reversed ten times for obtaining averaged voltages. Each current bias lasts about 16 milliseconds before it was reversed. When the pogo pin scans through the interface between alloy electrode and the TE material, as shown in FIG. 3a, the detected voltage includes four constituents:

$$V = V_{solder} + V_{alloy} + V_c + V_{TE} = I(R_{solder} + R_{alloy} + R_c + R_{TE}) \quad (4)$$

$$R_{alloy} = \frac{\rho_{alloy} l_{alloy}}{A} \quad (5)$$

$$R_c = \frac{\rho_c}{A} \quad (6)$$

-continued $$R_{TE} = \frac{\rho_{TE} l_{TE}}{A} \quad (7)$$

where $R_{solder}$ comes from the solder and the interface between the solder and the alloy electrode, $R_{alloy}$ comes from the electrode layer, $R_c$ is the contact resistance between electrode alloy and TE material, and $R_{TE}$ comes from the TE material; A is the cross-sectional area of the leg; $\rho_{alloy}$ and $\rho_{TE}$ are the bulk resistivity of the alloy and TE material, respectively; $\rho_c$ is the specific contact resistivity at the interface between alloy and TE material, $l_{alloy}$ and $l_{Te}$ are the thickness of alloy and TE material on the left side of the pogo pin, respectively. $V_c$ was obtained by subtracting the extrapolated $V_{TE}$ ($V_A$) from $V_{alloy}$ at the position where the alloy layer ends ($V_B$). Then the specific contact resistivity was obtained using the above equations.

FIG. 1A illustrates the dependence of thermal conductivity on the temperatures of both the Ni-doped and un-doped samples. The Ni-doped sample indicated by the unfilled circles exhibited a lower conductivity than the un-doped sample indicated by the filled squares, and a decreasing thermal conductivity value as the temperature was increased. While nickel (Ni) is used as a dopant in this example, other possible dopants include, but are not limited to, cobalt (Co), iron (Fe), and boron (B). The thermal conductivity of the Ni-doped sample in FIG. 1A is lower than the un-doped sample, but this data indicates it may also be desirable as an electrode/barrier material.

FIG. 1B illustrates the effect of temperature on the resistivity of Ni-doped and un-doped samples. FIG. 1C illustrates the effect of temperature on the Seebeck coefficient of Ni-doped and un-doped samples. As seen in FIGS. 1B and 1C, as compared with the pure $CoSi_2$ hot-pressed at 1200° C., the Ni-doped $CoSi_2$ prepared at 820° C., exhibited similar electrical resistivity and Seebeck coefficient. It is to be understood that this doping method is illustrative and that other methods of doping that produce a homogenous ingot of material capable of being ball-milled and hot-pressed or otherwise thermo-mechanically processed as described above may also be used.

Figure 1D:
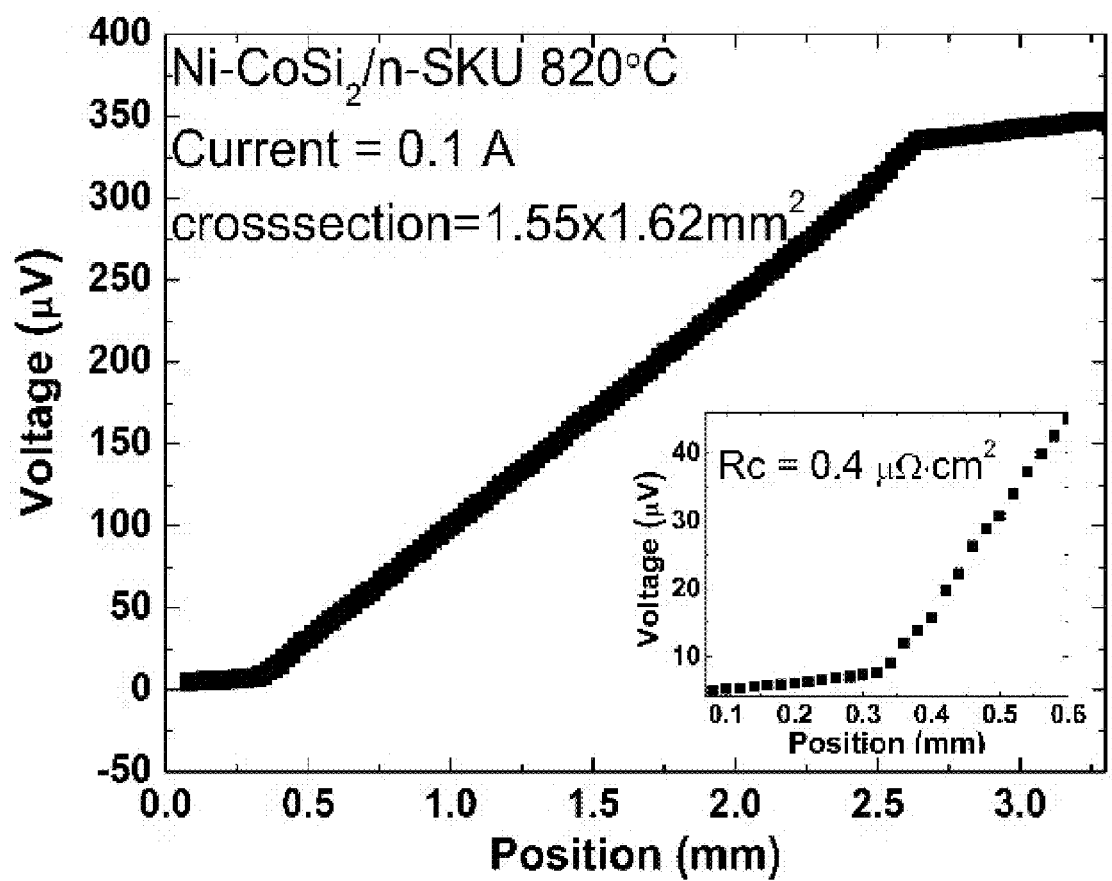
FIG. 1D shows the result of a resistance scan along a n-type thermoelectric filled skutterudite leg according to certain embodiments of the present disclosure.

The Ni-doped $CoSi_2$ powder was hot-pressed together with n-type filled skutterudite powder at 820° C. to form the thermoelectric leg. In this example, the thickness of the $CoSi_2$ layer on two ends of the leg is 0.5 mm. In alternate embodiments, the thickness of the $CoSi_2$ layer may be about 0.01 mm thick to about 1.0 mm thick, or, for example, from about 0.02 mm to about 0.5 mm, or from about 0.05 mm to about 0.2 mm. FIG. 1D shows the result of a resistance scan along a thermoelectric leg according to embodiments of the present disclosure. The inset graph is an exploded view of the left-hand side of the larger FIG. 1D. As indicated in the inset graph, the specific contact resistance between n-SKU and Ni-doped $CoSi_2$ layer in this leg is around 0.4 $\mu\Omega \cdot cm^2$, which is much lower than previously reported number from other group. In alternate embodiments, the specific contact resistance may be lower than 0.4 $\mu\Omega \cdot cm^2$.

Figure 2A:
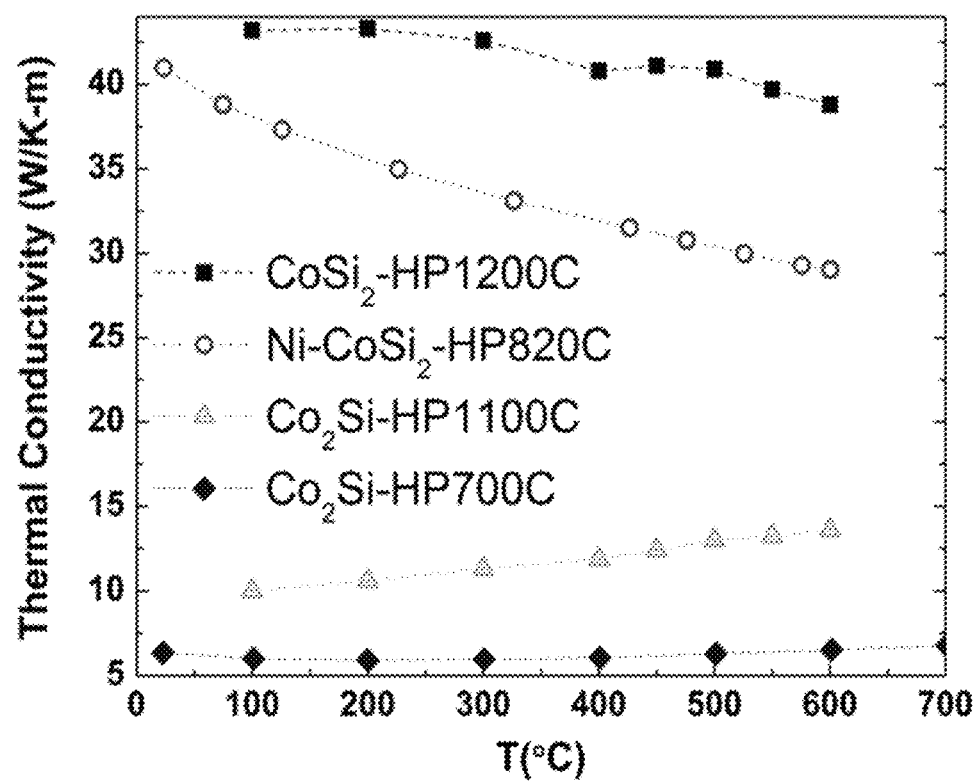
FIGS. 2A-2B illustrate the comparative thermal conductivity and electrical resistivity of $CoSi_2$, $Co_2Si$, and Ni-doped $CoSi_2$ which were hot-pressed at various temperatures according to certain embodiments of the present disclosure.
Figure 2B:
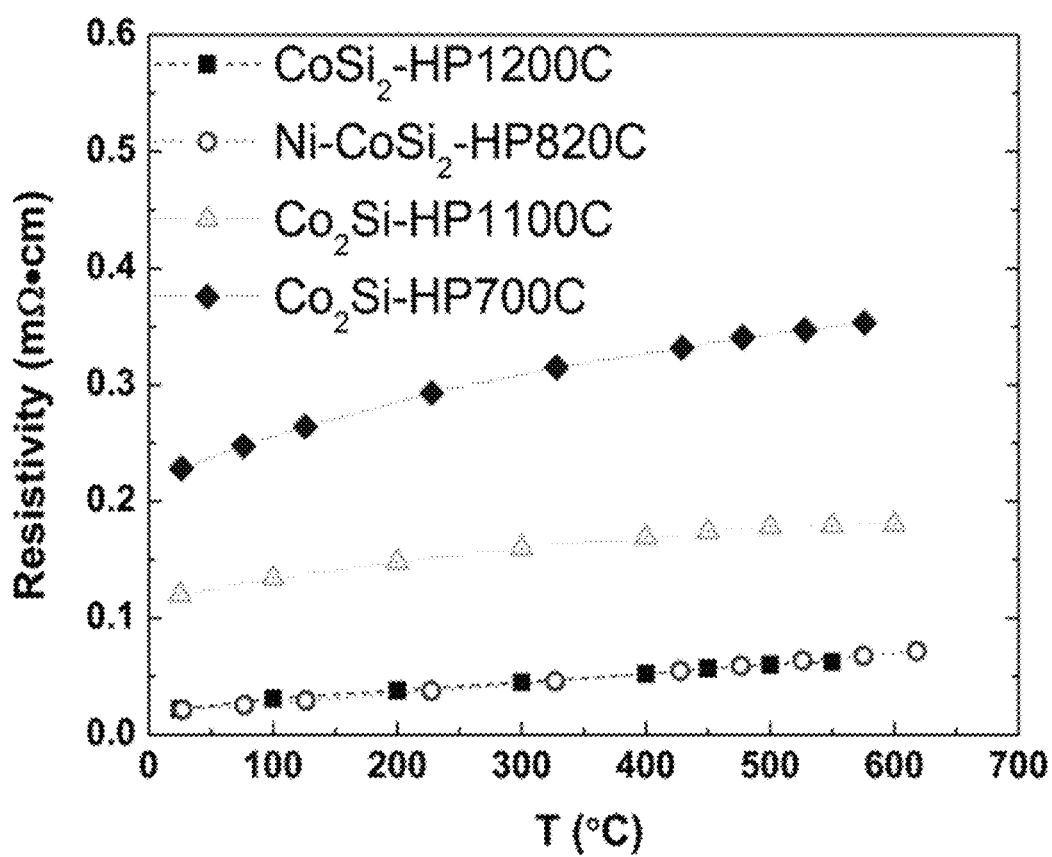

FIGS. 2A-2B illustrate the comparative thermal conductivity and electrical resistance of $CoSi_2$, $Co_2Si$, and Ni-doped $CoSi_2$ which were each hot-pressed at various temperatures. FIG. 2A illustrates the effect of temperature on four samples: $CoSi_2$, $Co_2Si$ hot-pressed at two different temperatures, and Ni-doped $CoSi_2$. As seen in FIG. 2A, the $Co_2Si$, as compared with $CoSi_2$, has a lower thermal conductivity and, as shown in FIG. 2B, $Co_2Si$ has much higher electrical resistivity compared to $CoSi_2$. So it may be desirable to find an alternative contact material with higher thermal and electrical conductivity for p-type filled skutterudite to replace $Co_2Si$.

For p-type filled skutterudite, an Fe-based alloys comprising Cr, Ni, and/or Co were prepared as discussed above. In this example, an FeNi-based alloy containing cobalt (Co) was used, but chromium (Cr) may also be used, and this alloy may be used instead of a Co—Si material for p-type filled skutterudite since these metals have high thermal and electrical conductivity. At the same time, the CTEs of these metals and p-type filled skutterudite may be comparable. The ratio of Co:Fe:Ni used for the first sample was 1:1:2. Four more alloys with different compositions (which may be referred to herein as alloy samples of varying compositions) were prepared by ball-milling Cr powder, Fe powder and Ni powder for 1 hour and hot-pressing the mixed powder at 700° C. for 5 minutes. The ratios used for the samples prepared with Cr:Fe:Ni were 3:1:6, 1:3:1, 3:6:1, and 2:6:2. The ratios for both the Co and Cr alloys are exemplary ratios and are not exhaustive of the ratios that produce thermoelectric compounds with desirable properties. In an embodiment, a $Co_{0.25}Fe_{0.25}Ni_{0.5}$ alloy is prepared by ball-milling Co powder (2.5 grams), Fe powder (2.5 grams) and Ni powder (5 grams) for 1 hour and hot-pressing the mixed powder at 700° C. for 5 minutes.

Figure 3B:
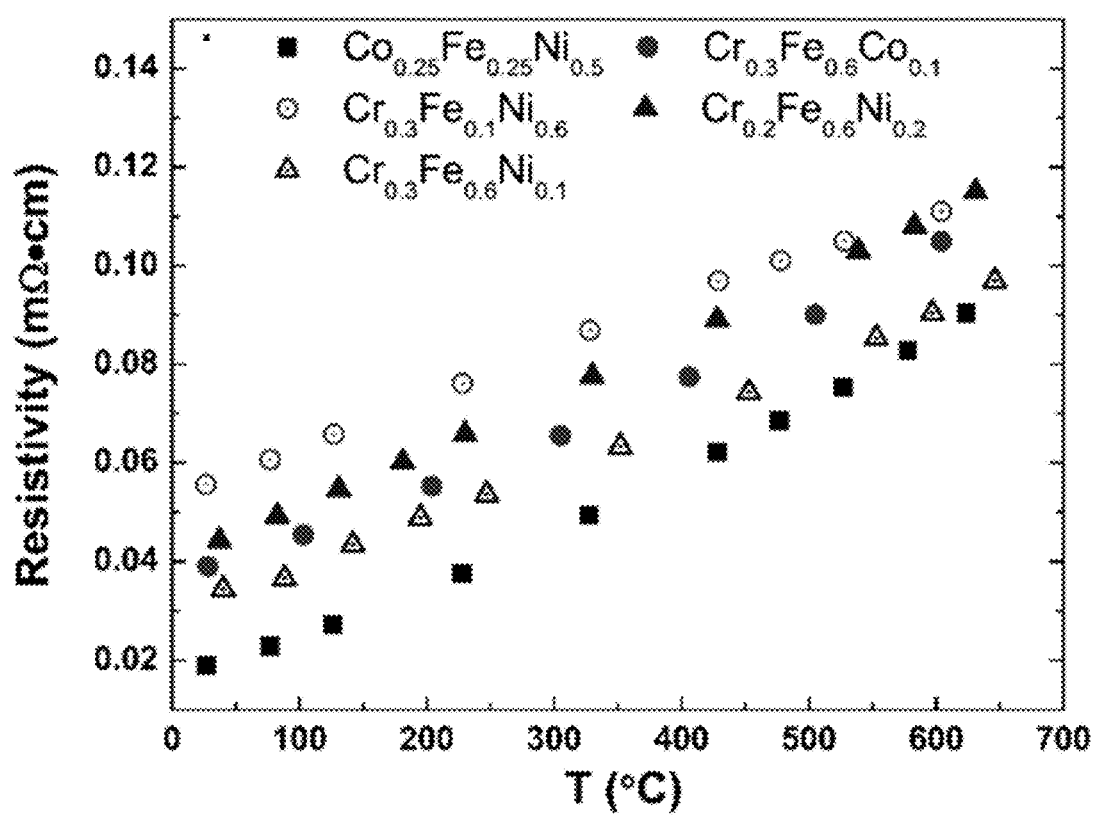

FIGS. 3A-3D illustrate the effect of increasing temperature on the thermal conductivity, resistivity, coefficient of thermal expansion, and Seebeck coefficient, of different barrier materials with multiple alloy compositions. The pure component metals Cr, Fe, Ni, Co have high electric and thermal conductivity as compared to the alloy compositions. For example, the resistivities of pure Cr, Fe, Co and Ni are, respectively, about 0.0125, 0.0096, 0.00624, and 0.00693 m$\Omega$-cm. FIG. 3A illustrates the effect of temperature on the thermal conductivity of each of the alloy samples of varying composition. As compared with the $Co_2Si$ thermal conductivity results in FIG. 2A, the Co—Fe—Ni alloy and Cr—Fe—Ni alloys have high thermal conductivity. FIG. 3B illustrates the effect of increasing temperature on the resistivity of each of the alloy samples of varying composition. As compared with the $Co_2Si$ thermal conductivity results in FIG. 2B, all these alloys have lower resistivity.

The thermal conductivities of Cr, Fe, Co and Ni are 93.9, 80.4, 100, and 90.9 W m$^{-1}$ K$^{-1}$, respectively. Because the preparation temperature is much lower than the melting point of these alloys, the densities of the pellets are ~6.6 g cm$^{-3}$ (about 85% of the theoretical density of these alloys ~7.77 g cm$^{-3}$). Therefore, the prepared samples have a lower thermal conductivity (FIG. 3A) and higher electrical resistivity (FIG. 3B) as compared with those of the pure component metals. However, both thermal conductivity and electrical conductivity of these alloys are about one order of magnitude higher than that of the p-type filled skutterudite, which is desirable for the contact layer. Furthermore, the thickness of the alloy layer can, in some embodiments, be made as thin as 0.2 mm after polishing, which reduces the thermal and electrical resistance introduced by the contact layers.

Figure 3C:
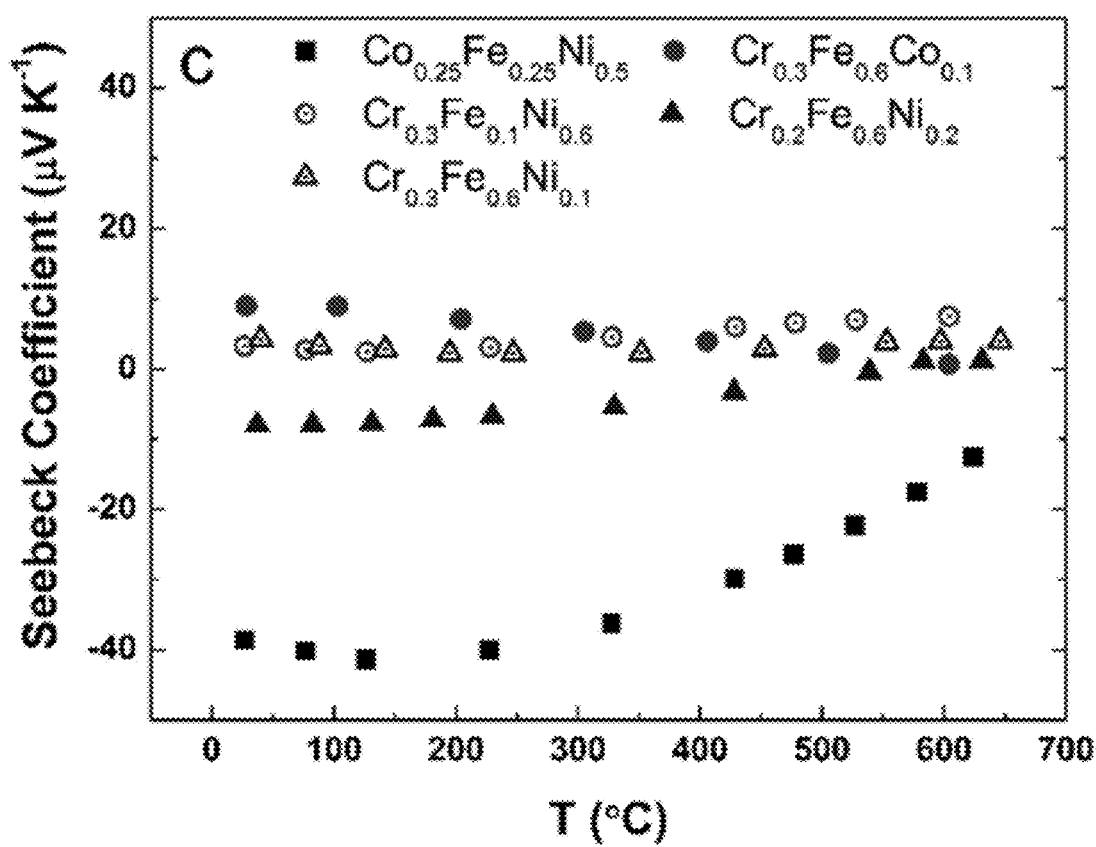
Figure 3D:
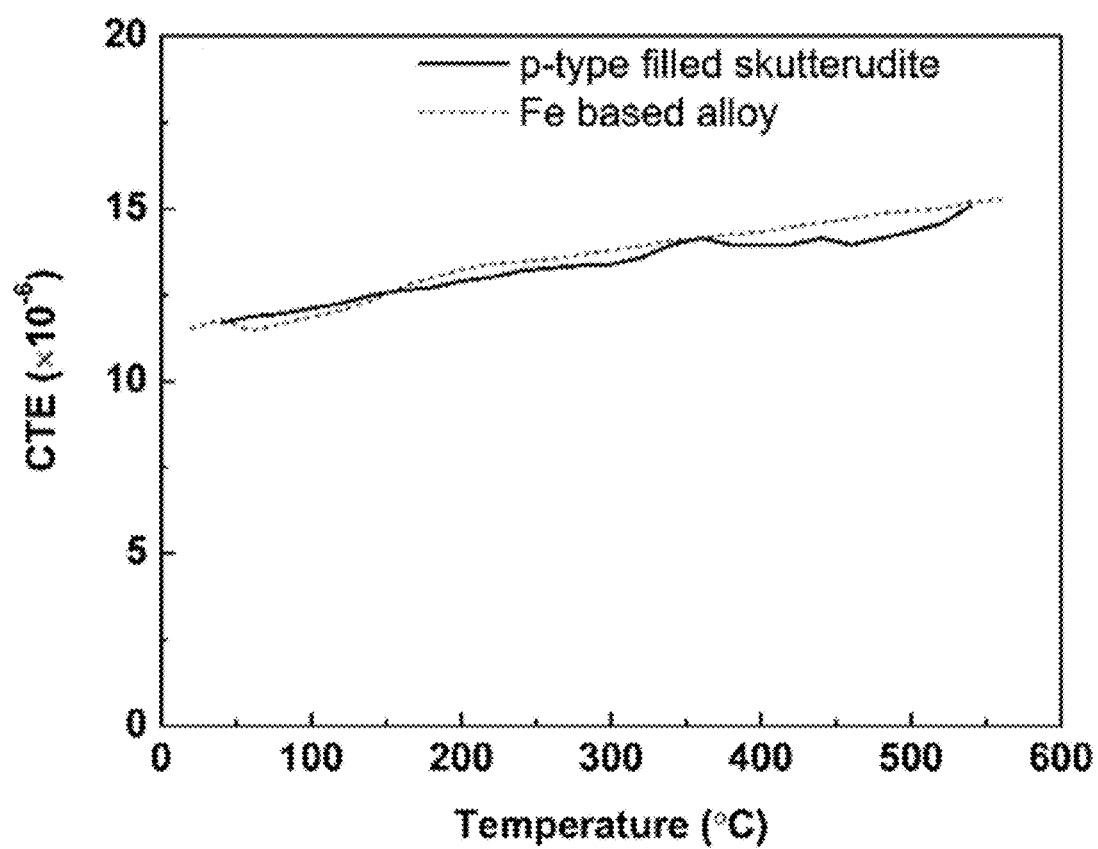

FIG. 3C illustrates the effect of increasing temperature on the Seebeck coefficient of each of the alloy samples of varying composition. As shown in FIG. 3C, the absolute values of Seebeck coefficient of the Cr—Fe—Ni alloys are relatively small. With higher Cr concentration, the Seebeck coefficient of Cr—Fe—Ni alloys can be pushed to positive value from room temperature to 700° C. The alloys discussed herein are candidates as the electrode material for at least p-type filled skutterudite. Among these alloys, the samples with high Cr concentration show very small negative or even positive Seebeck coefficients from room temperature to 600° C., as shown in FIG. 3C. FIG. 3D compares the coefficient of thermal expansion (CTE) of p-type filled skutterudite and the CTE of the alloy contact material $Cr_{0.3}Fe_{0.6}Ni_{0.1}$ prepared as disclosed herein up to ~550° C. The CTE of alloy is close to that of p-type filled skutterudite, and substantially similar to that of other alloys according to embodiments of the present disclosure. FIG. 3D illustrates the effect of increasing temperature on the coefficient of thermal expansion (CTE) for an Fe-based alloy $Cr_{0.3}Fe_{0.6}Ni_{0.1}$ and a p-type filled skutterudite fabricated according to embodiments of the present disclosure.

FIGS. 4A-4E illustrate the contact resistance between alloys of varying compositions and p-type filled skutterudite. Each of FIGS. 4A-4D represents the contact resistance of one of the alloy sample compositions. The preparation procedures of alloys and TE legs are the same as discussed above with respect to the ball-milling and hot pressing steps. The alloy with the work function closest to p-SKU had the lowest contact resistance of ~0.4 $\mu\Omega \cdot cm^2$. It is understood that the results as described herein are illustrative of certain resultant properties for varying contact material compositions, and that this disclosure is not limited to these exemplary compositions or methods.

By comparing the Seebeck coefficient, work function, and contact resistance of the alloys as shown in FIGS. 3A-3C and 4A-4D, it was determined that the Seebeck coefficient may not be the dominant factor. It was also observed that the work function difference between SKU and electrode material may be playing more of a role in determining the contact resistance. In an embodiment, the contact resistance decreases when there is a smaller (decreasing) work function difference between the materials that are pressed together. It is understood from the discussion herein that other electrode/barrier materials with a work function very close (substantially similar) to that of p-type or n-type filled skutterudite may also be used for applications such as thermoelectric legs for electrical contacts as well as other applications where one material is hot pressed or otherwise in proximity to another material where at least some similar thermoelectric characteristics, for example, the work function, between the at least two materials are desired. In some embodiments, this may mean that the work functions of the respective materials are within about 1.0 eV of each other, in other embodiments the work functions may be within about 0.5 eV or less of each other.

Figure 4A:
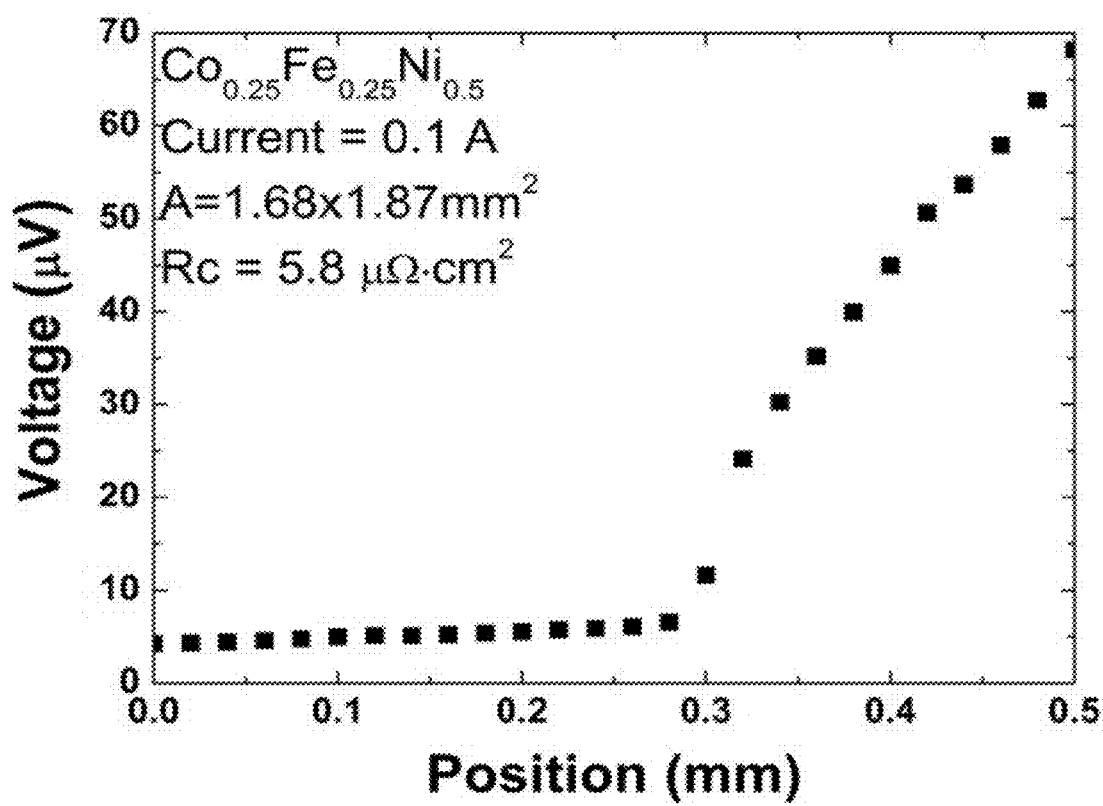
FIGS. 4A-4E illustrate the contact resistance between alloys of varying compositions and p-type filled skutterudite.
Figure 4B:
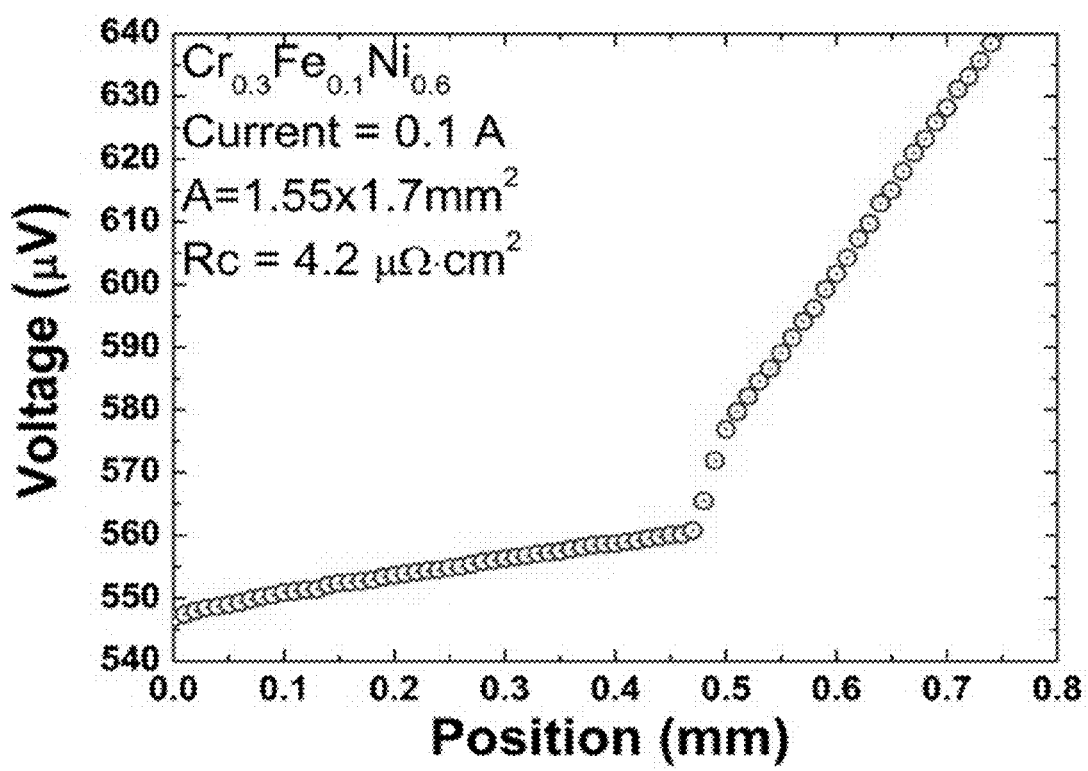
Figure 4C:
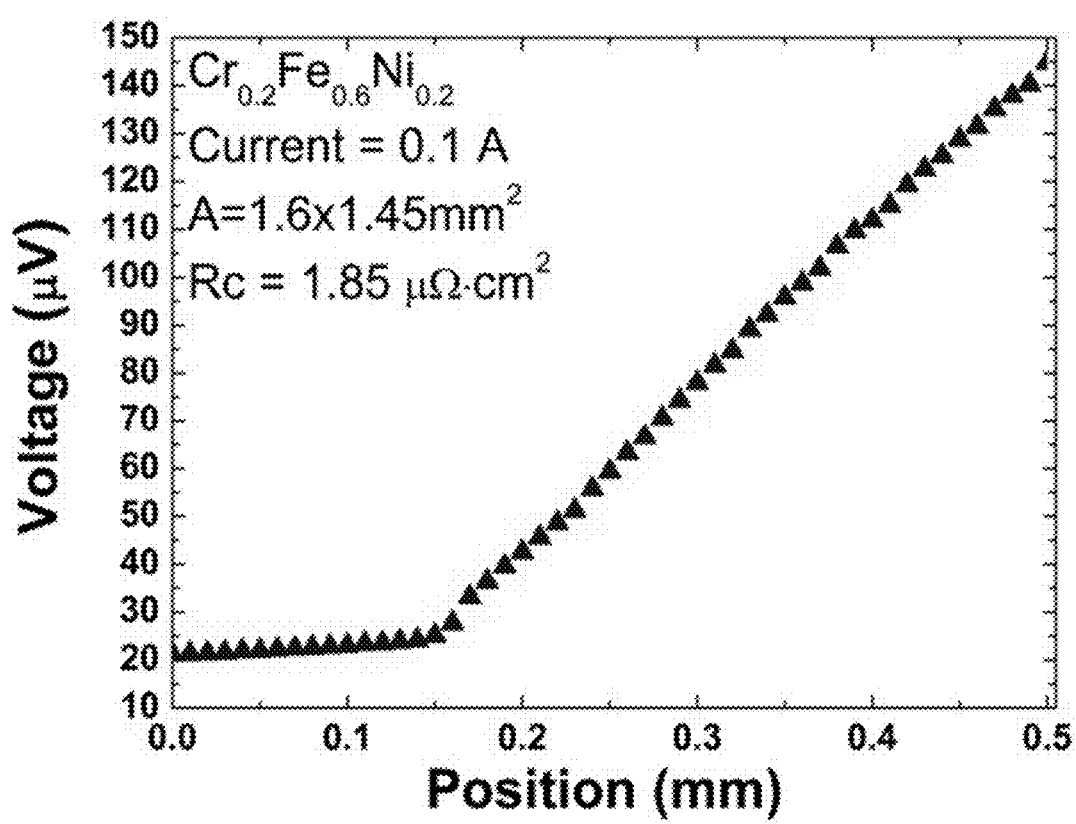
Figure 4D:
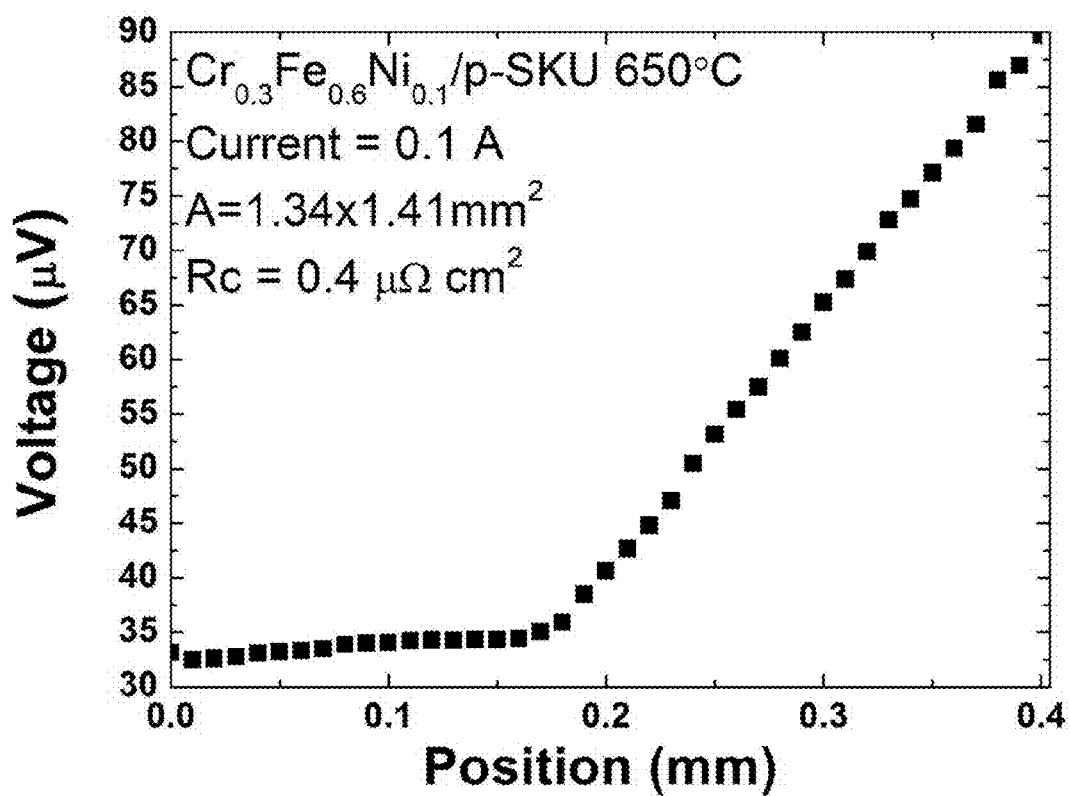
Figure 4E:
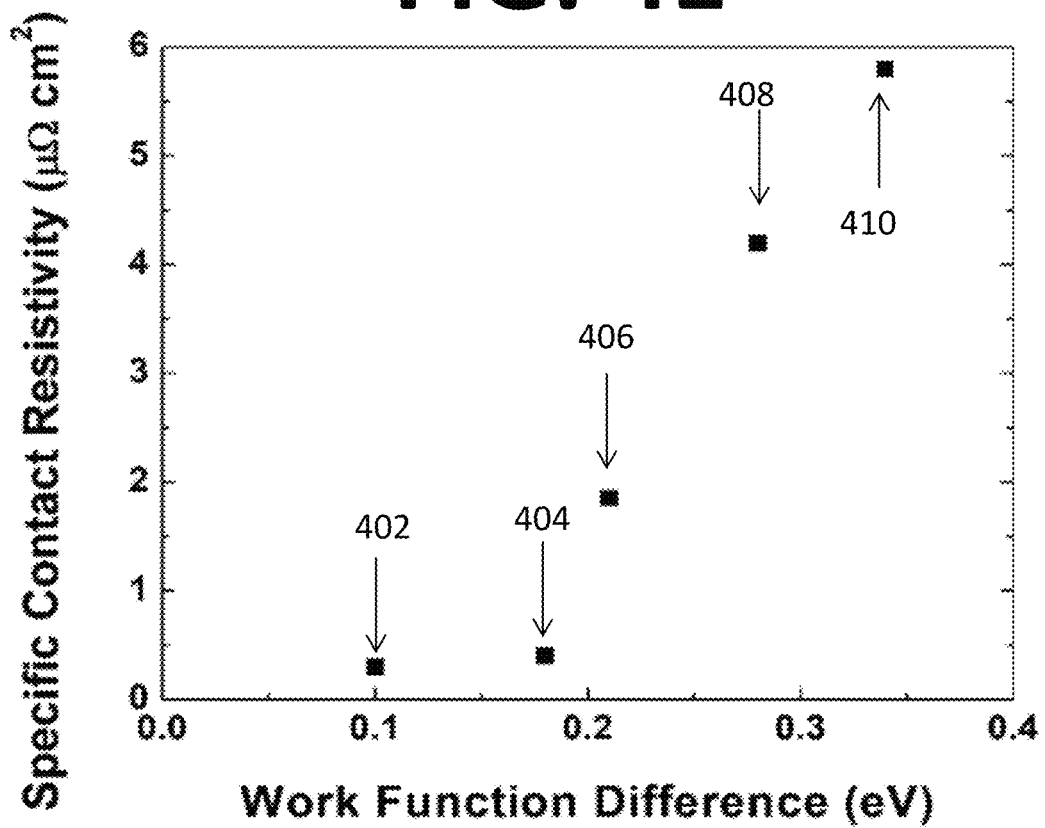

FIG. 4E illustrates the work function difference between the contact alloys and p-type filled skutterudite. Each point on this figure represents the alloy compositions respectively such that 402 indicates $Cr_{0.3}Fe_{0.6}Co_{0.1}$, 404 indicates $Cr_{0.3}Fe_{0.6}Ni_{0.1}$, 406 indicates $Cr_{0.2}Fe_{0.6}Ni_{0.2}$, 408 indicates $Cr_{0.3}Fe_{0.1}Ni_{0.6}$, and 410 indicates $Co_{0.25}Fe_{0.25}Ni_{0.5}$. Table 1 shows the calculated work functions $\phi$ of the Sb terminated (100) and (111) surfaces of $Co_4Sb_{12}$, $CeFe_4Sb_{12}$, and $NdFe_4Sb_{12}$, and the work function of $Ce_{0.45}Nd_{0.45}Fe_{3.5}Co_{0.5}Sb_{12}$ obtained by their weighted average. For filled skutterudites, the differences between (100) and (111) surfaces are small. Since it has been shown the (111) surfaces contribute more to the total surface area, the $\phi$ of the (111) surface (4.44 eV) was used as the approximated value for polycrystalline $Ce_{0.45}Nd_{0.45}Fe_{3.5}Co_{0.5}Sb_{12}$.

FIGS. 10A and 10B are images taken using an SEM of the interface between the TE material and the contact layer. The TE material with contact layers were observed under SEM. As shown in FIG. 10A, the alloy and p-type filled skutterudite bind very well with each other. The interface shown in FIG. 10B looks sharp and clean even under high magnification. Both materials look homogeneous. No pores can be seen at the interface which is an indication that there is no severe reaction (that could lead to component failure) between p-type SKU and alloys as fabricated discussed herein.

Figure 5:
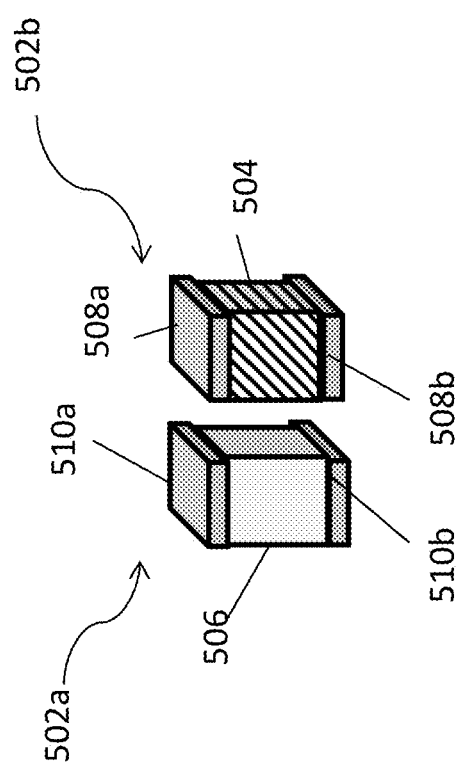
FIG. 5 is an illustration of an isometric view of thermoelectric legs according to certain embodiments of the present disclosure.
Figure 6:
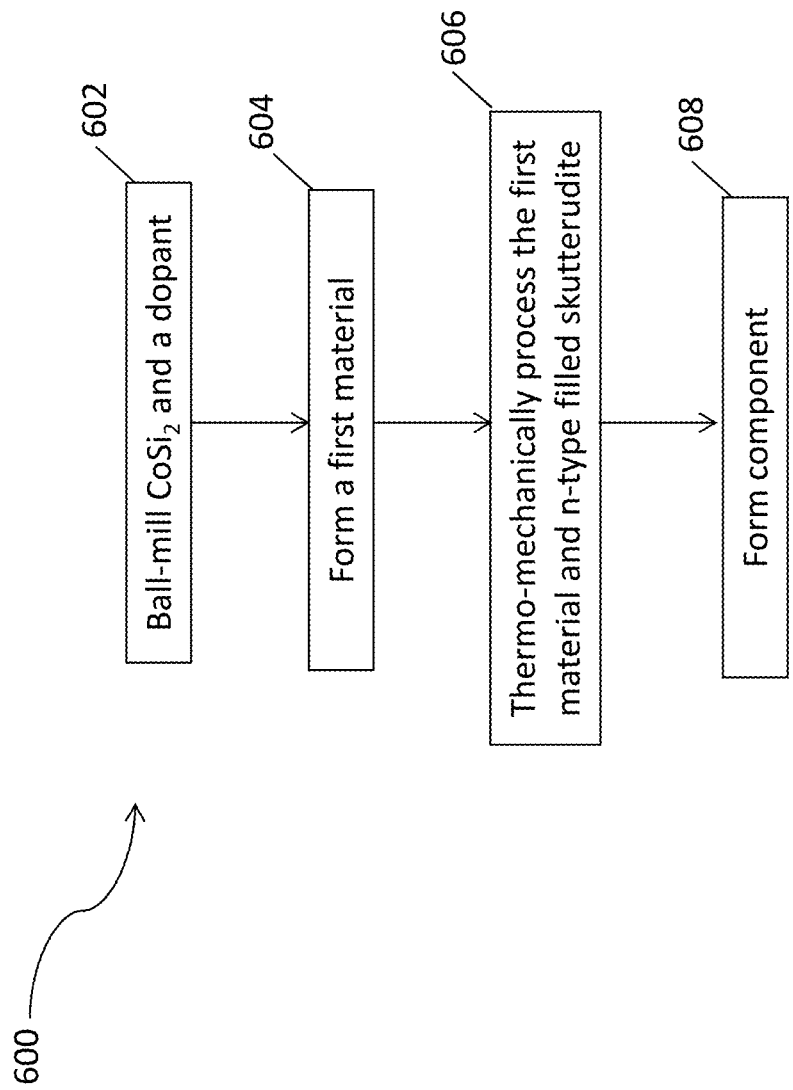
FIG. 6 is a flow chart of an embodiment of a method of fabricating electrical contacts according to certain embodiments of the present disclosure.
Figure 7:
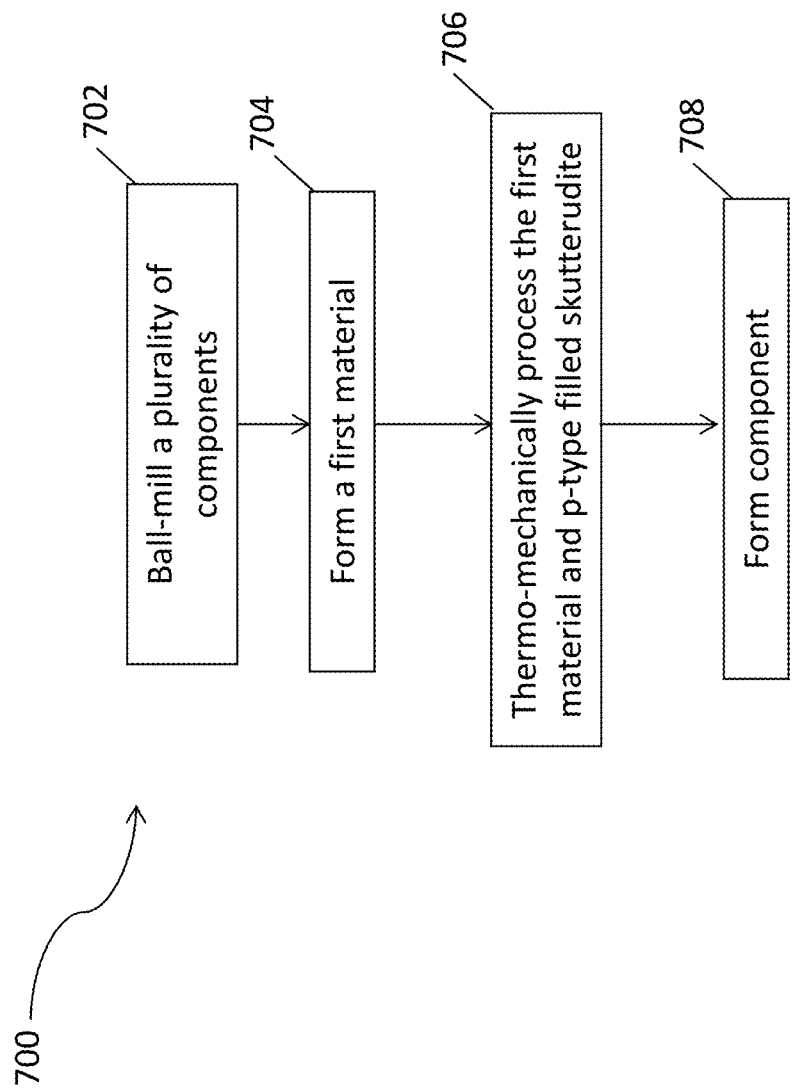
FIG. 7 is a flow chart of an embodiment of a method of fabricating electrical contacts according to certain embodiments of the present disclosure.

FIGS. 5, 6, and 7 are discussed below. In the illustration 502a of a thermoelectric leg in FIG. 5, an n-type filled skutterudite layer 506 is disposed between a first barrier layer 510a and a second barrier layer 510b. This may also be described as a layer of a first material 506 disposed between layers 510a and 510b of a second material. In method 600, a thermoelectric leg that may be similar to 502a in FIG. 5 is fabricated with doped-$CoSi_2$ and n-type filled skutterudite that may be similar to 502a in FIG. 5. While the fabrication of individual thermoelectric legs is discussed herein, in some embodiments, multiple thermoelectric legs may be fabricated simultaneously or in series depending upon the configuration of the manufacturing equipment.

In FIG. 6 at block 602, a first barrier layer material such as doped-$CoSi_2$ is ball-milled, for example, using a high-energy ball mill. The doped-$CoSi_2$ may have been manufactured by homogenizing a dopant, for example, nickel (Ni), cobalt (Co), iron (Fe), boron (B), or combinations thereof, with the $CoSi_2$ for example by annealing for a period of at least two hours. In some embodiments, the annealing time may last for up to 20 hours, and in alternate embodiments the annealing period may last up to about seven days. The concentration dopant may be about 0.2 wt. % to about 5.0 wt. % of the doped-$CoSi_2$.

Subsequent to homogenization, which may occur between 600° C. and about 1200° C. for about between about 1 hour and about 7 days, the doped-$CoSi_2$ is ball-milled at block 602 for at least three minutes, and in an alternate embodiment up to five hours. At block 604, a first powdered material is formed subsequent to ball-milling at block 602. This first powdered material is hot pressed with n-type filled skutterudite at block 606 to form a component such as a thermoelectric leg for an electrical contact at block 608. The first powder may form a first and a third layer similar to barrier layers 510a and 510b in FIG. 5, and the second powder may be disposed between 510a and 510b similar to 506 in FIG. 5.

The first powder and the second powder may be hot-pressed at block 606 for at least about 3 minutes. In some embodiments, a thermo-mechanical processing time of less than three minutes or greater than three minutes, for example, up to five hours, may be appropriate. In an embodiment, the first powder and the second powder are hot pressed at a temperature between about 600° C. and about 900° C. While, in one embodiment, the hot-pressing may occur at a temperature between about 600° C. and about 900° C., or ranges within that range, in some embodiments the hot-pressing temperature may range between about 815° C. and about 825° C. In an alternate embodiment, there may be one or more thermo-mechanical processing steps at block 606 which may include hot-pressing and other known methods of thermo-mechanically processing.

While the discussion herein focuses on the manufacture of thermoelectric legs for electrical contacts, the methods and systems disclosed herein could be used to manufacture other thermoelectric compositions as well. In an embodiment, at block 608, subsequent to thermo-mechanical processing at block 606 the contact resistance between the first material and the second material at either or both of the interfaces of layers 510a and 506 or layers 510b and 506 is less than about 1.0 $\mu\Omega \cdot cm^2$. In various embodiments, the specific contact resistivity may be within a range of less than about 10.0 µΩ·cm², for example, between about 1.0 µΩ·cm² and about 8.0 µΩ·cm², between about 3.0 µΩ·cm² and about 7.0 µΩ·cm², between about 0.01 µΩ·cm² and about 0.9 µΩ·cm², between about 0.10 µΩ·cm² and about 0.8 µΩ·cm², between about 0.2 µΩ·cm² and about 0.7 µΩ·cm², between about 0.01 µΩ·cm² and about 0.5 µΩ·cm², between about 0.5 µΩ·cm² and about 1.0 µΩ·cm², or in overlapping ranges between about 0.01 µΩ·cm² and about 10.0 µΩ·cm².

While FIG. 5 shows different patterns on the n-type 506 and p-type 504 skutterudite, these patterns are merely illustrative to indicate that the components of the middle layers are made from different material types. It is further to be understood that, while rectangular-style legs are shown in FIG. 5, the systems and methods disclosed herein may be used to manufacture other shapes such as spheres, half-spheres, cylinders, squares, other three-dimensional geometries and combinations of geometries as appropriate for intermediate processing and/or end applications. In addition, since FIG. 5 is merely illustrative, it is to be understood that the layers of the skutterudite of n-type or p-type and the layer of barrier material may not be visible to the eye without magnification, but that the layers are shown here to demonstrate the configuration of the layers used for thermo-mechanical processing at blocks 606 and 706 as discussed in FIG. 6 above and FIG. 7 below.

Turning to FIG. 7, in method 700, a component that may be similar to 502b in FIG. 5 is fabricated with a plurality of materials, for example, combinations of cobalt (Co), chromium (Cr), iron (Fe), nickel (Ni), and p-type filled skutterudite. In FIG. 7, at block 702, a plurality of components are ball-milled. These components may be in powder form, foil, pellet, disc, or other form that can be ball-milled. In an embodiment, the components are ball-milled for at least three minutes, and in an alternate embodiment up to five hours. The materials may comprise, for example, cobalt (Co), chromium (Cr), iron (Fe), nickel (Ni), as well as other elements and combinations and alloys thereof where the work function of the element, combination, or alloy is close to/compatible with/substantially similar to that of p-type filled skutterudite. In one embodiment, the materials comprise Cr, Fe, and Ni and the ratio Cr:Fe:Ni is about 3:6:1. In an alternate embodiment, the materials comprise Co, Fe, and Ni and the ratio Co:Fe:Ni is about 1:1:2.

A first material is formed at block 704 subsequent to ball-milling as discussed above. The first material formed at block 704 this is a powdered material capable of being thermo-mechanically processed. FIG. 5 shows a thermoelectric leg 502b that has a layer of p-type skutterudite 504 disposed between two layers of barrier material 508a and 508b made from the first material formed at block 704 in FIG. 7. It is appreciated that in both the embodiments shown in 502a and 502b, the relative thickness of the skutterudite (506, 504) layers and the barrier layers (510a, 510b, 508a, 508b) are merely illustrative. As such, in some embodiments, one barrier layer (510a, 510b, 508a, 508b) may be thicker than the other and, in alternate embodiments, one or more of the barrier layers (510a, 510b, 508a, 508b) may be about the same thickness.

The first material formed at block 704 may be similar to that used for the barrier layers 508a and 508b in FIG. 5. In an embodiment, the first material formed at block 704 and the p-type filled skutterudite are thermo-mechanically processed at block 706. Prior to thermo-mechanical processing, the p-type filled skutterudite may be disposed between two layers of the first material. The disposed layers may be hot-pressed at block 706, for example, between about 600° C. and about 900° C., or at other ranges within this range. In an alternate embodiment, the first material formed at 704 and the p-type filled skutterudite are thermo-mechanically processing by hot-pressing, for example, between about 690° C. and about 710° C. In an alternate embodiment, there may be more than one thermo-mechanical processing steps at block 706 which may include hot-pressing.

In an embodiment, the first material used for layers 508a and 508b which may also be described as a first powder and the second powder 504 may be hot-pressed at block 706 for at least about 3 minutes, and, in some embodiments, a time of less than three minutes or greater than three minutes, for example, up to five hours, may be appropriate. The hot-pressing may form a component similar to 502b in FIG. 5 where 504 which represents the p-type filled skutterudite is disposed in between two barrier layers 508a and 508b of the first material before hot-pressing. At block 708, subsequent, to thermo-mechanical processing, a component such as a thermoelectric leg as shown by 502a in FIG. 5 is formed. In an embodiment, the specific contact resistivity of first material and the second material at either or both of the interfaces of layers 508a and 504 or layers 508b and 504 is less than about 1.0 µΩ·cm². The specific contact resistivity may be within a range of less than about 1.0 µΩ·cm², for example, between about 0.01 µΩ·cm² and about 0.9 µΩ·cm², between about 0.10 µΩ·cm² and about 0.8 µΩ·cm², between about 0.2 µΩ·cm² and about 0.7 µΩ·cm², between about 0.01 µΩ·cm² and about 0.5 µΩ·cm², between about 0.5 µΩ·cm² and about 1.0 µΩ·cm². Also at block 708, in some embodiments, the Seebeck coefficient of the barrier layers 508a and 508b is positive.

Figure 9A:
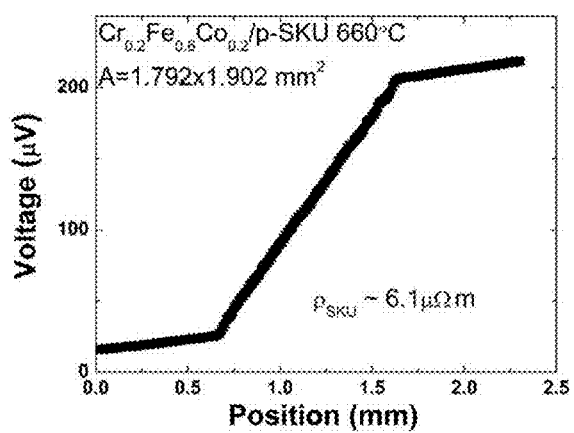
FIGS. 9A and 9B illustrate the contact resistance of p-type filled skutterudite before and after thermal cycling test according to certain embodiments of the present disclosure.
Figure 9B:
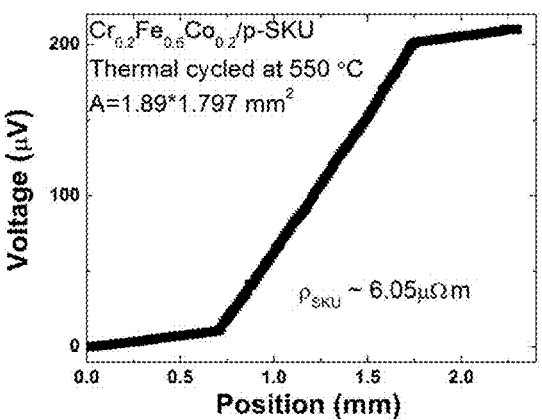

FIGS. 9A and 9B illustrate the contact resistance of p-type filled skutterudite before and after thermal cycling test according to certain embodiments of the present disclosure. FIG. 9A illustrates the contact resistance measurements between a p-type skutterudite leg and a contact interface fabricated according to embodiments of the present disclosure using a barrier layer according to the formula $Cr_{0.2}Fe_{0.6}Co_{0.2}$. FIG. 9B illustrates the contact resistance measurements between a p-type skutterudite leg and a contact interface fabricated according to embodiments of the present disclosure according to the formula $Cr_{0.2}Fe_{0.6}Co_{0.2}$, where the p-type legs were thermo-cycled 12 times within 3 days at about 550° C. There is no observable change on contact resistance before and after this thermal cycling test. Also as illustrated by the electrical resistivity values of p-type filled skutterudite in FIG. 9A (~6.1 µΩm) and the corresponding close value in FIG. 9B after thermal cycling (~6.05 µΩm) which are calculated from the curves in FIGS. 9A&B, the p-type skutterudite TE leg and the contact interface material are a stable combination at a working temperature, which indicates compatible/substantially similar/close work functions (differing by 0.05 µΩm) as defined herein.

At least one embodiment is disclosed and variations, combinations, and/or modifications of the embodiment(s) and/or features of the embodiment(s) made by a person having ordinary skill in the art are within the scope of the disclosure. Alternative embodiments that result from combining, integrating, and/or omitting features of the embodiment(s) are also within the scope of the disclosure. Where numerical ranges or limitations are expressly stated, such express ranges or limitations should be understood to include iterative ranges or limitations of like magnitude falling within the expressly stated ranges or limitations (e.g., from about 1 to about 10 includes, 2, 3, 4, etc.; greater than 0.10 includes 0.11, 0.12, 0.13, etc.). For example, whenever a numerical range with a lower limit, $R_l$, and an upper limit, $R_u$, is disclosed, any number falling within the range is specifically disclosed. In particular, the following numbers within the range are specifically disclosed: $R=R_l+k*(R_u-R_l)$, wherein k is a variable ranging from 1 percent to 100 percent with a 1 percent increment, i.e., k is 1 percent, 2 percent, 3 percent, 4 percent, 5 percent, . . . , 50 percent, 51 percent, 52 percent, . . . , 95 percent, 96 percent, 97 percent, 98 percent, 99 percent, or 100 percent. Moreover, any numerical range defined by two R numbers as defined in the above is also specifically disclosed. Use of broader terms such as "comprises," "includes," and "having" should be understood to provide support for narrower terms such as "consisting of," "consisting essentially of," and "comprised substantially of." Accordingly, the scope of protection is not limited by the description set out above but is defined by the claims that follow, that scope including all equivalents of the subject matter of the claims. Each and every claim is incorporated into the specification as further disclosure and the claims are embodiment(s) of the present invention.

While exemplary embodiments of the invention have been shown and described, modifications thereof can be made by one skilled in the art without departing from the scope or teachings herein. The embodiments described herein are exemplary only and are not limiting. Many variations and modifications of the compositions, systems, apparatus, and processes described herein are possible and are within the scope of the invention. Accordingly, the scope of protection is not limited to the embodiments described herein, but is only limited by the claims that follow, the scope of which shall include all equivalents of the subject matter of the claims. Unless expressly stated otherwise, the steps in a method claim may be performed in any order. The recitation of identifiers such as (a), (b), (c) or (1), (2), (3) before steps in a method claim are not intended to and do not specify a particular order to the steps, but rather are used to simplify subsequent reference to such steps.

What is claimed is:

1. A method of manufacturing a thermoelectric component comprising:
    thermo-mechanically processing a ball-milled first material with a second material to form a thermoelectric component, wherein the first material comprises $CoSi_2$ and at least one of nickel (Ni), cobalt (Co), iron (Fe), boron (B), or combinations thereof at a concentration from about 0.2 wt. % to about 5.0 wt. %, wherein the second material comprises n-type filled skutterudite, and wherein the second material is disposed in contact with a first layer of the first material and a second layer of the ball-milled first material prior to thermo-mechanical processing;
    wherein, subsequent to thermo-mechanical processing, a specific contact resistance between the first layer of the first material and the second material is less than about $10.0\ \mu\Omega\cdot cm^2$, and wherein a specific contact resistance between the second layer of the first material and the second material is less than about $10.0\ \mu\Omega\cdot cm^2$.

2. The method of claim 1, further comprising annealing the first material and subsequently ball-milling the first material for at least two hours prior to thermos-mechanical processing to form a first powder.

3. The method of claim 2, further comprising homogenizing the first material at a temperature between about 800° C. and about 1200° C. from about 1 hour to about 7 days.

4. The method of claim 1, wherein thermo-mechanically processing the first layer of the first material, the second layer of the first material, and the second material comprises using hot-pressing.

5. The method of claim 4, further comprising hot-pressing the first material and the second material at a temperature between about 600° C. and about 900° C.

6. The method of claim 1, further comprising hot-pressing the first material and the second material for at least about 3 minutes.

7. The method of claim 1, wherein the specific contact resistance between the first material and the second material from about $0.2\ \mu\Omega\cdot cm^2$ to about $1\ \mu\Omega\cdot cm^2$.

8. The method of claim 1, wherein the specific contact resistance between the first material and the second material is from about $0.3\ \mu\Omega\cdot cm^2$ to about $0.8\ \mu\Omega\cdot cm^2$.

9. The method of claim 1, wherein a work function of the first material is substantially similar to a work function of the n-type filled skutterudite.

* * * * *